United States Patent [19]
Albano et al.

[11] 3,958,133
[45] May 18, 1976

[54] DIGITAL NOISE DISCRIMINATOR

[75] Inventors: Rocco V. Albano, Meriden; Robert J. Fraleigh, Vernon; Jack E. Steffens, Ellington, all of Conn.

[73] Assignee: United Technologies Corporation, Hartford, Conn.

[22] Filed: Mar. 3, 1975

[21] Appl. No.: 554,805

[52] U.S. Cl. .............................. 307/234; 328/112; 328/162; 328/165
[51] Int. Cl.[2] ..................... H03K 5/153; H03K 5/18
[58] Field of Search .......... 307/231, 232, 234, 236, 307/247 A; 328/109–112, 114, 162, 165, 164

[56] References Cited
UNITED STATES PATENTS

| | | | |
|---|---|---|---|
| 3,315,246 | 4/1967 | Huffman et al. | 307/232 X |
| 3,753,007 | 8/1973 | Viswanathan | 307/247 A |
| 3,828,258 | 8/1974 | Hills et al. | 307/234 X |

Primary Examiner—John Zazworsky
Attorney, Agent, or Firm—Donald F. Bradley

[57] ABSTRACT

A digital circuit discriminates between valid transitions in the level of a two level logic signal in which the signal remains at its new level for a predetermined time period, and those transitions in the level of the logic signal which may be caused by noise. Upon the transition of the logic signal from one level to another, a timer is actuated. If the logic signal remains in its new level until the timer expires, the transition is considered valid and an output signal indicative thereof is produced. If the logic signal reverts to its initial level before the timer expires, the transition is considered invalid, the timer is reset and no output signal is produced. A discrete output is produced when a valid transition occurs between either of the two separate logic signal levels.

4 Claims, 4 Drawing Figures

DIGITAL NOISE DISCRIMINATOR

BACKGROUND OF THE INVENTION

1. Field of the Invention

This invention relates to a system which will discriminate between valid transitions from one level to the other level of a two level logic signal, and those transitions caused by noise. The system uses digital circuits to reject short time duration input pulses which represent noise and to accept as valid only those input signal transitions which exist for at least a predetermined time duration. Once a valid transition from a first to a second level is sensed, the system changes its state, generates an output signal which indicates that a valid transition has occurred, and thereupon functions to discriminate between transitions from the second to the first level.

2. Description of the Prior Art

There are numerous electronic circuits which will produce an output signal only when an input signal is present for a predetermined time period. Many such prior art circuits use counters or integrators to determine the time duration of the input signal. It has been found, however, that many of the prior art circuits are very sensitive to high frequency noise which is present in the input signal, and will not function properly in a noisy environment. The prior art circuits, in addition, are generally sensitive only to input signals of a predetermined polarity or direction, and will not respond to changes in both directions between two signal levels as commonly occur in digital logic networks.

Similar deficiencies occur in the prior art circuits which are designed to eliminate or discriminate against contact bounce or chatter. Many of these circuits will function properly to eliminate the noise that occurs upon the actuation of a switch, but will not function properly if noise occurs shortly thereafter.

A particular problem occurs in digital logic circuits where transitions occur in both directions between two discrete levels. For example, to discriminate between both the opening and closing of a switch, three signal lines per switch are required with the prior art circuits. If the switch is in a noisy environment, such as the points in an automobile ignition system, additional circuitry is required to filter or eliminate the noise in the signal and to validly discriminate between opening and closing of the switch. In some environments, additionally, conventional analog filters cannot be employed without loading down or sacrificing the noise immunity of the digital logic circuits.

SUMMARY OF THE INVENTION

The present invention overcomes the limitations of the prior art by discriminating or filtering in the time domain as opposed to the frequency domain. It is based on the premise that a noise pulse or spike has a time duration which is less than that of a valid transition from one of two discrete levels to the other level in a logic signal.

In a preferred embodiment of the invention, the digital noise discriminator system consists of logic circuitry having four logic states, two of which are stable resting states in which the system remains depending on whether the input is in one or the other of the two discrete levels, the two levels being either high or low. If the discriminator system is in its low resting state, any input signal which signifies a low to high transition will cause the system to switch to a temporary state and turn on a timer. If a high to low transition occurs while the timer is operating, the system returns to its stable low state to await another low to high transition. The timer is reset and disabled. If no high to low transition occurs before the timer expires, the system considers the input signal as a valid transition and advances to a high stable state. A first output signal is produced indicating that a valid low to high transition has occurred.

As long as the input signal is high, the system remains in its high stable state. An input signal containing a high to low transition will cause the system to advance to a temporary state and will start the timer. As described previously, the system will then either return to its high stable state if a low to high transition occurs during the operation of the timer, or advance to the low stable state if no low to high transition occurs. If the system advances to its low stable state, a second output signal is generated indicating that a valid high to low transition has occurred.

In accordance with a preferred embodiment of the present invention, there is provided an electronic logic circuit containing three flip flops. The input signal is connected to one of the three flip flops, and the output of another of the flip flops controls the actuation of a synchronous digital counter. Logic circuitry is connected to respond to the state of the flip flops and the state of the counter in order to produce discrete output signals when a valid transition of the input signal occurs.

In accordance with another embodiment of the present invention, two flip flops and a monostable multivibrator are used together with circuit logic to respond to the transitions in the input signal and produce discrete output level signals as a function of the state of the input signal.

DESCRIPTION OF THE PREFERRED EMBODIMENT

The present invention may be used in conjunction with any system which produces an electrical signal having two discrete levels. Such signals commonly occur in digital logic systems. The basic utility of the present invention is in discriminating between valid transitions between the two electrical signal levels as opposed to transient fluctuations in the signal level produced by noise spikes or the bouncing of a switch. Another use of the present invention is distinguishing between the signal level transitions produced from one of several sources, such as where the desired transition will exist for a longer time period than the undesired transitions.

Figure 1:
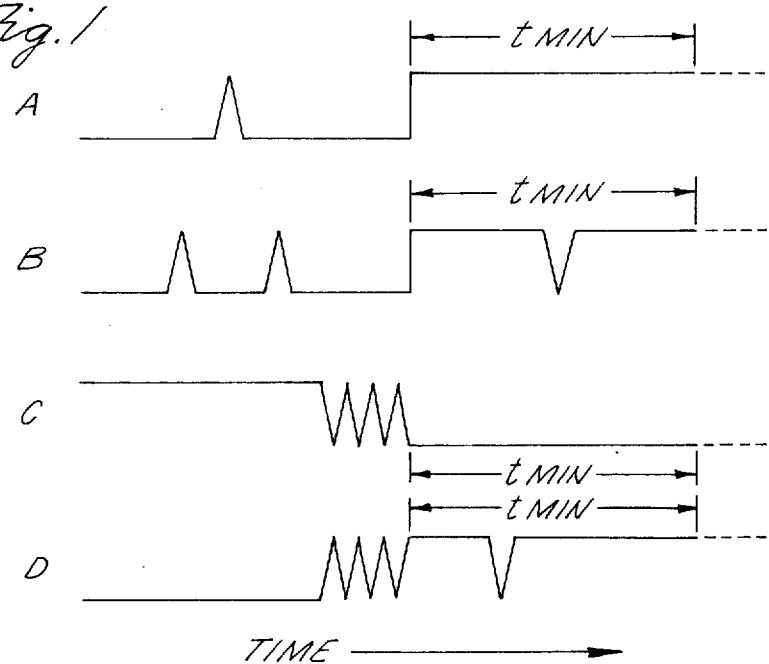
FIG. 1 shows representative waveforms indicating valid and invalid transitions.

Referring to FIG. 1 waveforms A, B, C and D are shown which illustrate in waveforms A and C a transition between two signal levels that would be considered valid transitions by the present invention, and which illustrate invalid transitions in waveforms B and D. The criterion for a valid transition is that the transition from one signal level to another signal level remains at the second signal level for a time at least equal to or greater than $t_{min}$ without undergoing a transition back to the first signal level during that time period. The waveforms shown in FIG. 1 show time as the abscissa and signal level as the ordinate, the signal level normally being voltage, but current or some other electrical property may be used as long as the signal level has two discrete states.

Waveform A of FIG. 1 shows a valid transition from a low state to a high state. Waveform B shows a transition from a low state to a high state which is invalid since a negative going spike occurred during the time $t_{min}$. Waveform C shows a valid high to low transition and illustrates a signal typically produced by the bouncing of an electrical contact. Waveform D shows an invalid low to high transition due to the negative going spike occurring during the time $t_{min}$.

Figure 2:
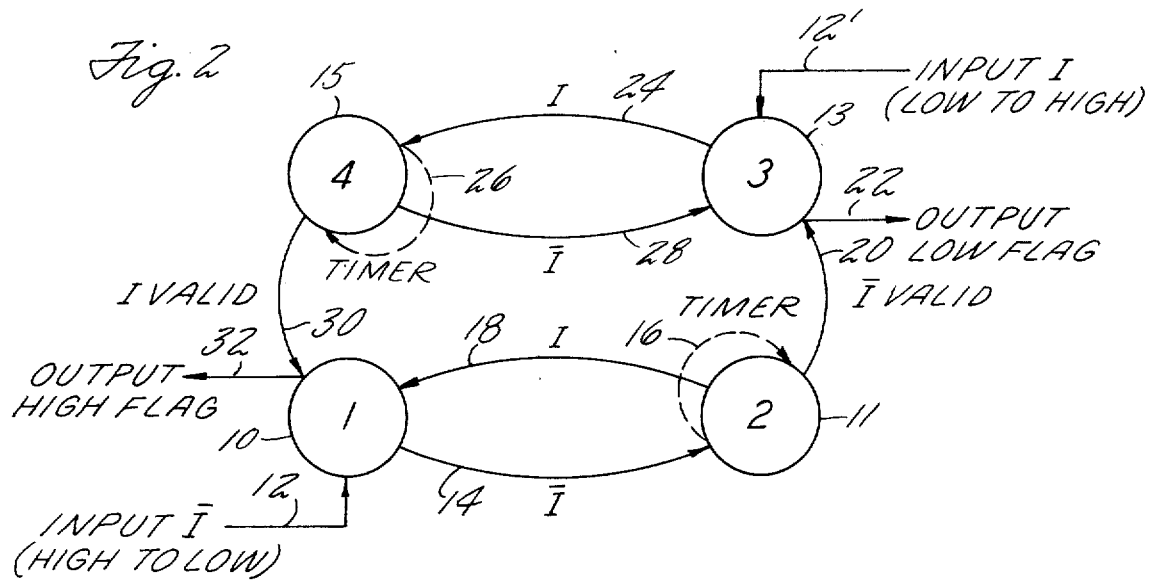
FIG. 2 is a state diagram showing the four logic levels of the invention.

FIG. 2 is a logic state diagram illustrating the operation of the present invention. The implementation of the logic may take many forms, two of which are shown in conjunction with FIGS. 3 and 4.

Referring to FIG. 2, the digital noise discriminator consists of four logic states, states 1, 2, 3 and 4. Logic states 1 and 3 are stable resting states in which the discriminator remains depending on whether the input to be filtered is high or low.

Logic state 1, shown by reference numeral 10, is the stable system state when the input signal is high, a high input being indicated as I, and a low input by $\overline{I}$. Assuming the system is in logic state 1 in which the input is I, any input signal $\overline{I}$ appearing on input line 12 exhibiting a high to low transition will be sensed by the system, and the system will transfer from logic state 1 to logic state 2 as shown by line 14. Logic state 2, shown by reference numeral 11, is not a stable state. Upon the transfer of the system from logic state 1 to logic state 2, a timer equal to $t_{min}$ is started as shown by dotted line 16. If the input line 12 contains a low to high transition I during the period when the timer is actuated, the system returns to logic state 1 as shown by line 18. The timer is then reset, and the system remains in stable logic state 1 awaiting another high to low transition $\overline{I}$ on input line 12. If, however, the time $t_{min}$ expires while the system is in logic state 2 without the input containing any low to high transitions I, the system advances to stable logic state 3 as shown by line 20, and initiates an output low flag signal on line 22. Logic state 3 is shown by reference numeral 13. The output low flag signal indicates that the input $\overline{I}$ on signal line 12 was a valid nonbouncing high to low transition with a width greater than $t_{min}$.

Logic state 3 is a stable state and signifies that the input to the system is low ($\overline{I}$). As long as the input remains low, the system remains in stable logic state 3. As soon as the input on line 12' contains a low to high transition I, the system advances from logic state 3 to logic state 4 as shown by line 24 and restarts the timer shown by dotted line 26. Logic state 4 is shown by reference numeral 15. If the input has a high to low transition $\overline{I}$ before the time $t_{min}$ expires, the system returns to logic state 3 as shown by line 28 to await a new low to high transition I. Again the timer is reset. If, however, no high to low transition $\overline{I}$ occurs during the time $t_{min}$, the input transition I on line 12' is recognized as a valid and bounce free low to high transition, and the system then advances to stable logic state 1 as shown by line 30. Upon transferring from logic state 4 to logic state 1, an output high flag signal is generated on line 32 signifying that input 12' contained a valid low to high transition I equal to or greater than $t_{min}$.

Figure 3:
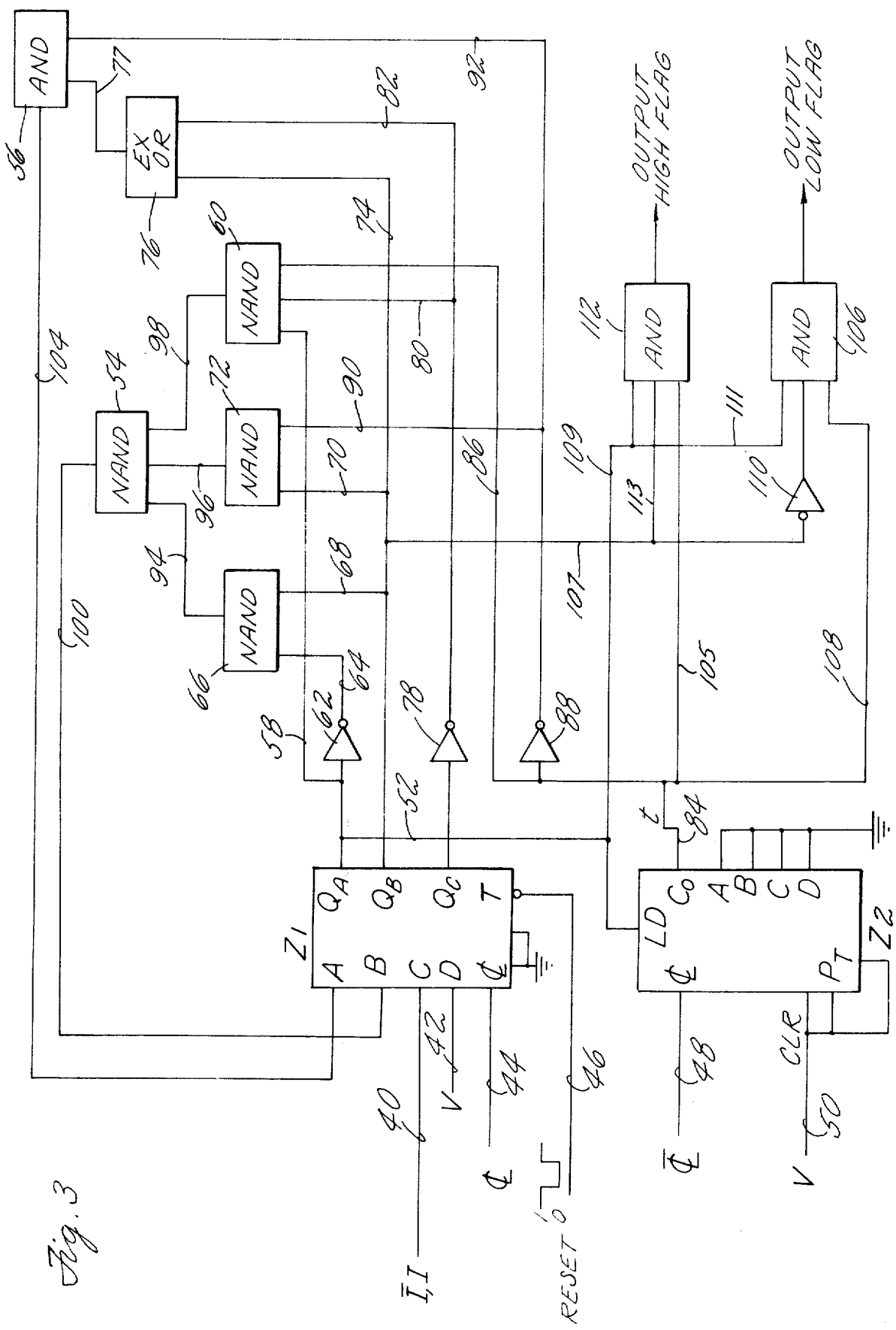
FIG. 3 is a schematic drawing in partial block diagram form showing a preferred implementation of the invention.

FIG. 3 shows a preferred circuit embodiment of the present invention. Referring to FIG. 3 there are illustrated two integrated circuit blocks Z1 and Z2. Circuit block Z1 is a logic circuit which may be, for example, circuit Ser. No. 74163 manufactured by Texas Instruments containing flip flops $Q_A$, $Q_B$ and $Q_C$, and circuit Z2 may be a synchronous digital counter Ser. No. 74161 manufactured by Texas Instruments. The input signal, which is either a high input I or a low input $\overline{I}$ as shown on lines 12 and 12' of FIG. 2, is fed via line 40 to input terminal C of circuit block Z1. Line 42 to input D of circuit block Z1 supplies a DC voltage V of, for example, +5 V. Also fed to circuit block Z1 are clock pulses at a representative frequency of 600 KHz on line 44, and a reset pulse on line 46. Fed as inputs to circuit block Z2 are the clock pulses on line 48 and the supply voltage V on line 50.

Assume initially that the circuit block Z1 has been reset by a reset pulse on line 46 which will reset flip flops $Q_A$, $Q_B$ and $Q_C$ to logic 0. Upon termination of the reset pulse, the next state of the circuit will depend on the level of the input signal on line 40. Assume that the input on line 40 is now low ($\overline{I}$) which will be represented by a logic 0 on line 40. A low input on line 40 will cause the circuit to transition to logic state 2 and initiate the counter Z2, and if the counter Z2 times out with the low input remaining on line 40, the circuit will transition to stable logic state 3 and produce an output low flag signal. The detailed explanation of the circuit operation is as follows.

Upon termination of the reset pulse, the outputs $Q_A$ and $Q_B$ from circuit block will be logic 0, and because a low ($\overline{I}$) input of logic 0 appears on line 40, the output $Q_C$ will also be logic 0. The logic 0 from output $Q_A$ is fed via line 58 to a NAND gate 60, and also through inverter 62 where it is inverted to a logic 1 and fed to a NAND gate 66 via line 64.

The logic 0 output from $Q_B$ is fed as an input to a NAND gate 66 via line 68, as an input to a NAND gate 72 via line 70, and as an input to an exclusive OR gate 76 via line 74. The logic 0 output from $Q_B$ is also fed via line 107 to an inverter 110 where it is inverted to a logic 1 and fed as an input to an AND gate 106.

The logic 0 output from $Q_C$, produced by the logic 0 on line 40, will be inverted by inverter 78 to a logic 1 and fed as an input to NAND gate 60 via line 80, and as an input to exclusive OR gate 76 via line 82.

The logic 0 at $Q_A$ is fed via line 52 to load input LD of circuit block Z2 and holds the circuit block Z2 in a reset state whereby the output $t$ on line 84 is a logic 0. The logic 0 on line 84 is fed via line 86 as an input to NAND gate 60. The logic 0 on line 84 is also inverted by inverter 88 to a logic 1 which is fed via line 90 as an input to NAND gate 72, and via line 92 as an input to an AND gate 56. The logic 0 on line 84 is also fed as an input to an AND gate 112 via line 105, and as an input to AND gate 106 via line 108.

The other inputs to AND gate 112 are a logic 0 appearing on line 109 which is connected to line 52, and a logic 0 on line 113. The other input to AND gate 106 is a logic 0 on line 111.

At this time the inputs to NAND gate 66 are a logic 1 and a logic 0, resulting in an output from NAND gate 66 of a logic 1 which is fed as an input to a NAND gate 54 via line 94. The inputs to NAND gate 72 are a logic 0 and a logic 1, resulting in an output from NAND gate 72 of a logic 1 which is fed as an input to NAND gate 54 via line 96. The inputs to NAND gate 60 are a logic 0, a logic 1 and a logic 0, resulting in an output from NAND gate 60 of a logic 1 which is fed as an input to NAND gate 54 via line 98.

Since the three inputs to NAND gate are logic 1's, the output from NAND gate 54 is a logic 0 which is fed via line 100 as an input to terminal B of circuit block Z1.

The two inputs to exclusive OR gate 76 are a logic 0 and a logic 1, resulting in an output from exclusive OR gate 76 of a logic 1 which is fed as an input to AND gate 56 via line 77.

The two inputs to AND gate 56 are both logic 1's, resulting in an output of a logic 1 which is fed via line 104 as an input to terminal A of circuit block Z1.

Upon the occurrence of the next clock pulse on line 44, the circuit will transition to logic state 2. In this state the counter Z2 will be initiated. If the low input ($\overline{I}$) remains on input line 40 when the counter Z2 expires, the circuit will transition to the stable logic state 3 and produce a low flag output signal. If, however, a high input I appears on input line 40 before the counter Z2 expires, the circuit will transition back to its initial stable logic state 1.

The transition to logic state 2 occurs as follows. The inputs to terminals A, B and C of circuit block Z1 are respectively a logic 1, a logic 0 and a logic 0. Upon the occurrence of the next clock pulse, the output $Q_A$ from circuit block Z1 becomes a logic 1. The appearance of a logic 1 on line 52 is fed to input LD of circuit block Z2 causing actuation of the counter. The counter Z2 has been preset by virtue of the inputs on terminals A, B, C and D of circuit block Z2 to count the full counter complement of 16 pulses, i.e., $t_{min}$ is equal to the time for 16 clock pulses to occur on line 48. The counter Z2 can be set to some count other than 16 by preconditioning the inputs A, B, C, and D of circuit block Z2 so that $t_{min}$ will be less than 16 counts.

The occurrence of a logic 1 at the output $Q_A$ of circuit block Z1 also changes the logic 0's on lines 58, 109 and 111 to logic 1's, and changes the logic 1 on line 64 to a logic 0, but the logic outputs from AND gates 56, 106 and 112, and the output from NAND gate 54, are not changed.

If the low input signal $\overline{I}$ on line 40 does not transition to a high signal I during the time $t_{min}$, the timer Z2 will time out and a logic 1 will appear on line 84, i.e., $t = 1$. The appearance of a logic 1 on line 84 will produce logic 1's on lines 86, 105 and 108, and logic 0's on lines 90 and 92. Since the three inputs to AND gate 106 are now all logic 1's, an output low flag signal is produced. At the same time the three inputs to NAND gate 60 are logic 1's, causing its output to become a logic 0 which in turn causes the output from NAND gate 54 to become a logic 1. Likewise the logic 0 on line 92 causes the output from AND gate 56 to become a logic 0. Upon the next clock pulse the outputs $Q_A$ and $Q_B$ of circuit block Z1 become respectively a logic 0 and a logic 1. The logic 0 at the output $Q_A$ is fed via line 52 to input LD in order to reset the counter Z2, changing the output $t$ on line 84 to a logic 0. The output low flag signal from AND gate 106 is now terminated, and the entire circuit assumes logic state 3.

If the input signal on line 40 had become high (I) before the counter Z2 counted 16 clock pulses, the output $Q_C$ from circuit block Z1 will become a logic 1 on the next clock pulse, and the outputs from both NAND gate 54 and AND gate 56 will be logic 0. This will make the inputs A and B of circuit block Z1 logic 0's, and the system will return to its initial logic state 1 on the next clock pulse in which $Q_A$ and $Q_B$ are both logic 0's.

Assuming that the circuit has transitioned to logic state 3, the outputs $Q_A$, $Q_B$ and $Q_C$ from circuit block Z1 are all logic 0's. The counter Z2 is reset due to the logic 0 on line 52. If the input on line 40 now becomes high (I = logic 1), upon the next clock pulse the output $Q_C$ of circuit block Z1 will become a logic 1, and the system will advance to logic state 4 where the outputs $Q_A$ and $Q_B$ from circuit block Z1 are both logic 1's. With output $Q_A$ a logic 1, the counter Z2 is enabled via line 52. If the input on line 40 returns to a logic 0 ($\overline{I}$) before the time $t_{min}$ has elapsed, i.e., before counter Z2 has counted 16 clock pulses, the system returns to logic state 3 and the counter Z2 is reset and disabled. The outputs $Q_A$, $Q_B$ and $Q_C$ revert to logic 0's in the logic state 3. If, however, the input on line 40 remains high (I) for a time of $t_{min}$, a logic 1 will appear on line 84 ($t = 1$) and the three inputs to AND gate 112 will be logic 1's, resulting in an output high flag signal from AND gate 112. At the same time the outputs from NAND gate 54 and from AND gate 56 will be logic 0's, and upon the next clock pulse the outputs $Q_A$ and $Q_B$ from circuit block Z1 will become logic 0's, thus resetting the counter Z2 via line 52 and terminating the output high flag signal. This is again logic state 1. The system will remain in logic state 1 as long as the input on line 40 is high. Once the input on line 40 becomes low ($\overline{I}$), the system will advance to logic state 2 as previously described.

Should a reset pulse appear on line 46, the system will remain in logic state 1 until the reset is removed and a low input ($\overline{I}$) appears on line 40.

In summary, whenever the input on signal line 40 makes a transition, it must remain at the new level for a time equal to or greater than the time $t_{min}$ in order to be considered a valid transition. By this mechanism, narrow noise pulses and switch bounces which appear as multiple transitions are distinguished from valid pulses and level changes in the input signal.

It will be apparent to those skilled in the art that complementary logic may be used in which NAND gates 60, 66 and 72 are replaced by AND gates, and NAND gate 54 is replaced by an OR gate.

Figure 4:
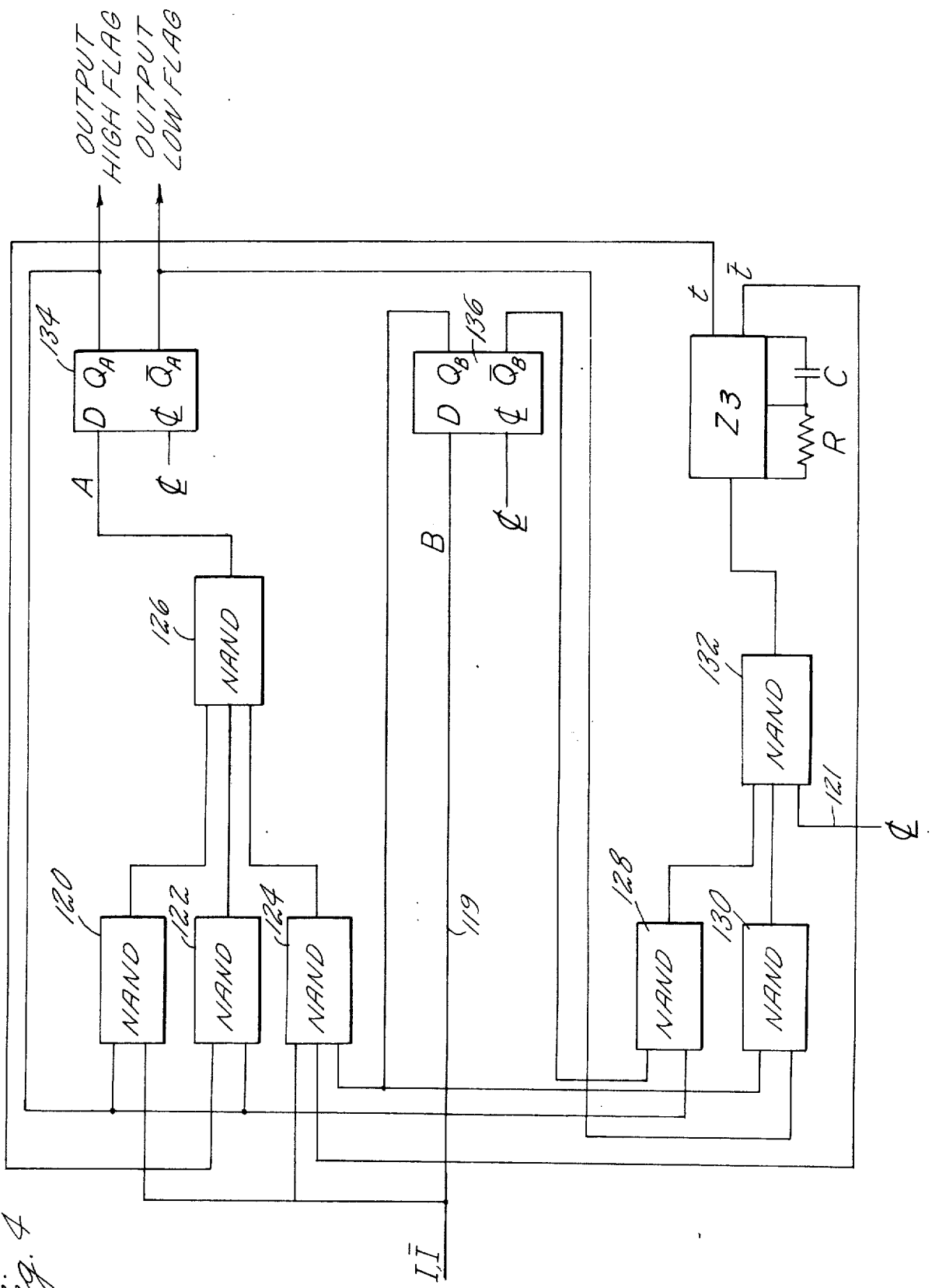
FIG. 4 is a schematic drawing of an alternate implementation of the invention.

The implementation of the digital noise discriminator described in conjunction with FIG. 3 may be represented by the following logic equations:

$A = \overline{I} \cdot [Q_B \oplus \overline{Q}_C]$
$B = (\overline{Q}_A \cdot Q_B) + (Q_B \cdot \overline{t}) + (Q_A \cdot \overline{Q}_C \cdot t)$
Output Low Flag $= Q_A \cdot \overline{Q}_B \cdot t$
Output High Flag $= Q_A \cdot Q_B \cdot t$ FIG. 4 shows a second implementation of the 4 state diagram of FIG. 2. The logic equations for the implementation of FIG. 4 are as follows:

$A = (Q_A \cdot \overline{t}) + (Q_A \cdot I) + (Q_B \cdot I \cdot \overline{t})$
$B = I$
Output High Flag $= Q_A$
Output Low Flag $= \overline{Q}_A$ The circuit configuration of FIG. 4 differs from that of FIG. 3 in that it uses only two flip flops 134 and 136, and the counter is replaced by a monostable multivibrator Z3, typically integrated circuit part number Ser. No. 74123 manufactured by Texas Instruments Corporation. The monostable multivibrator Z3 produces the timing $t_{min}$ by virtue of the resistor R and capacitor C connected thereto. As long as Z3 receives clock pulses from NAND gate 132, Z3 remains high ($t = 1$). When the clock pulses stop, multivibrator Z3 will remain high for a time $t_{min}$ that is determined by the RC combination, and then switch states so that $t = 0$. The next clock pulse received by Z3 will switch Z3 high again.

Assuming that the circuit of FIG. 4 is in logic state 1 wherein the input signal on line 119 is low (B = $\bar{I}$ = 0), A is logic 0, $Q_A$ is logic 0 and $Q_B$ is logic 0. The circuit at this time is generating an output low flag signal ($\bar{Q}_A$ = 1) indicating that the input on line 119 is low. The outputs from NAND gates 120, 122 and 124 are all logic 1's, and the output from NAND gate 126 is logic 0. The outputs from NAND gates 128 and 130 are logic 1's, thereby enabling NAND gate 132 and providing a series of clock pulses from line 121 to be fed to Z3 to keep the monostable multivibrator triggered ($t = 1$).

If the input or line 119 now goes high (B = I = 1), on the next clock pulse flip flop 136 will transition, and $Q_B$ will become a logic 1. With $Q_B$ a logic 1, the outputs from NAND gates 120, 122, 124 and 128 will remain logic 1's, the output from NAND gate 126 remains a logic 0, but the output from NAND gate 130 becomes a logic 0. The inputs to NAND gate 132 are now a logic 1, a logic 0, and the clock pulses on line 121. The clock pulses will not be fed from NAND gate 132 to Z3, thereby allowing Z3 to time out. This is logic state 2.

If the input signal on line 119 remains high when the time $t_{min}$ expires, $t$ will become a logic 0 ($\bar{t}= 1$), and the output from NAND gate 124 will become logic 0, producing a logic 1 from NAND gate 126. On the next clock pulse flip flop 134 will change states, making $Q_A$ a logic 1 and producing a high flag output. This is logic state 3.

If, however, the input signal on line 119 returns to its low state (B = $\bar{I}$ = 0) before $t_{min}$ has expired, flip flop 136 will transition, $Q_B$ will become a logic 0, the output from NAND gate 130 will become a logic 1, and clock pulses again will be fed to Z3. This is logic state 1.

Assuming that the circuit transitioned to logic state 3 in which B = I = 1, A is a logic 1, $Q_A$ is a logic 1, $Q_B$ is a logic 1, and $t$ is a logic 1 with Z3 being clocked. If the input on line 119 becomes low (B = $\bar{I}$ = 0), flip flop 136 transitions during the next clock pulse making $Q_B$ a logic 0, which in turn causes the output from NAND gate 128 to become a logic 0. In this state the clock pulses on line 121 are not fed to Z3, and Z3 will time out. This is logic state 4.

If $t_{min}$ expires while the signal on line 119 remains low, $t$ becomes logic 0 and the output from NAND gate 126 becomes a logic 0 (A = 0). On the next clock pulse $Q_A$ becomes logic 0, producing an output low flag signal. This is logic state 1.

If the input signal on line 119 becomes high (B = I = 1) before $t_{min}$ expires, the circuit reverts to logic state 3.

Complementary logic using AND and OR gates rather than NAND gates may be preferred in some implementations of the circuit of FIG. 4.

The output low flag and output high flag signals in the embodiment of FIG. 4 are signal levels, whereas the output low flag and output high flag signals in the embodiment of FIG. 3 are pulses. While the circuits may be used interchangeably in many applications, the particular type of output desired may determine which embodiment is used in a given system.

The implementations of the invention described in conjunction with FIGS. 3 and 4, while preferred embodiments thereof, are not to be considered as limiting the scope of the present invention since it is apparent that one skilled in the art, given the logic equations, can readily implement the invention in any one of numerous forms, all of which are equivalent and within the scope of the present invention.

We claim:

1. Apparatus for indicating a transition in a two level logic signal from one of said two levels to the other of said levels which remains at the other level for a selected time period, comprising a flip flop connected to receive said logic signal as an input thereto, means responsive to a transition in the signal level of said logic signal from a first level to a second level for producing a change in the output state of said flip flop, a timing means having a preselected timing period, means responsive to a change in the output state of said flip flop for actuating said timing means, means for resetting said timing means upon a transition in said logic signal from said second level to said first level during the time that said timing means is actuated, means responsive to the timing out of said timing means for producing a first output signal, means including said flip flop responsive to a transition in said logic signal from said second level to saif first level for actuating said timing means, means for resetting said timing means upon a transition in said logic signal from said first level to said second level during the time that said timing means is actuated, and means responsive to the timing out of said timing means for producing a second output signal.

2. Apparatus as in claim 1 in which said timing means is a digital counter.

3. Apparatus as in claim 1 in which said timing means is a monostable multivibrator.

4. A method for indicating a transition in a two level logic signal from one of said two levels to the other of said levels which remains at the other level for a selected time period, comprising sensing the occurrence of a transition in said logic signal, actuating a timing mechanism upon the occurrence of a transition in said logic signal from a first level to a second level, said timing mechanism having a predetermined timing period, resetting said timing mechanism upon the occurrence of a transition in said logic signal from said second level to said first level before expiration of said predetermined timing period, producing a first output signal upon expiration of said timing period, actuating said timing mechanism upon the occurrence of a transition in said logic signal from said second level to said first level, resetting said timing mechanism upon the occurrence of a transition in said logic signal from said first level to said second level before expiration of said predetermined timing period, and producing a second output signal upon expiration of said timing period.

* * * * *